(12) United States Patent
Ho et al.

(10) Patent No.: US 7,101,781 B2
(45) Date of Patent: Sep. 5, 2006

(54) INTEGRATED CIRCUIT PACKAGES WITHOUT SOLDER MASK AND METHOD FOR THE SAME

(75) Inventors: Kun-Yao Ho, Taipei (TW); Moriss Kung, Taipei (TW)

(73) Assignee: Via Technologies, Inc., Taipei (TW)

( * ) Notice: Subject to any disclaimer, the term of this patent is extended or adjusted under 35 U.S.C. 154(b) by 388 days.

(21) Appl. No.: 10/216,713

(22) Filed: Aug. 13, 2002

(65) Prior Publication Data

US 2003/0218055 A1 Nov. 27, 2003

(30) Foreign Application Priority Data

May 27, 2002 (TW) ................................ 91111221 A

(51) Int. Cl.
*H01L 21/44* (2006.01)
*B23K 31/02* (2006.01)

(52) U.S. Cl. .................. 438/612; 438/613; 228/123.1; 228/180.22

(58) Field of Classification Search ............ 228/123.1, 228/179.1; 361/767; 438/106, 108; 257/678, 257/737, 778, 779, 780, 787, 738, 751
See application file for complete search history.

(56) References Cited

U.S. PATENT DOCUMENTS

| | | | | |
|---|---|---|---|---|
| 3,771,217 A | * | 11/1973 | Hartman | 438/6 |
| 3,801,880 A | * | 4/1974 | Harada et al. | 257/752 |
| 4,736,521 A | * | 4/1988 | Dohya | 29/830 |
| 4,755,866 A | * | 7/1988 | Marshall et al. | 257/668 |
| 5,083,187 A | * | 1/1992 | Lamson et al. | 257/737 |
| 5,208,066 A | * | 5/1993 | Fujisaki et al. | 427/96 |
| 5,449,955 A | * | 9/1995 | Debiec et al. | 257/751 |
| 5,707,902 A | * | 1/1998 | Chang et al. | 438/614 |
| 5,841,190 A | * | 11/1998 | Noda et al. | 257/678 |
| 6,130,149 A | * | 10/2000 | Chien et al. | 438/613 |
| 6,140,707 A | * | 10/2000 | Plepys et al. | 257/778 |
| 6,165,885 A | * | 12/2000 | Gaynes et al. | 438/612 |
| 6,169,329 B1 | * | 1/2001 | Farnworth et al. | 257/780 |
| 6,174,824 B1 | * | 1/2001 | Michael et al. | 438/778 |
| 6,232,238 B1 | * | 5/2001 | Chang et al. | 438/725 |
| 6,383,720 B1 | * | 5/2002 | Nakashima et al. | 430/313 |
| 6,406,939 B1 | * | 6/2002 | Lin | 438/108 |
| 6,414,849 B1 | * | 7/2002 | Chiu | 361/760 |
| 6,472,239 B1 | * | 10/2002 | Hembree et al. | 438/18 |
| 6,569,712 B1 | * | 5/2003 | Ho et al. | 438/121 |
| 6,780,673 B1 | * | 8/2004 | Venkateswaran | 438/108 |
| 6,787,916 B1 | * | 9/2004 | Halahan | 257/777 |
| 2001/0013653 A1 | * | 8/2001 | Shoji | 257/738 |
| 2002/0090804 A1 | * | 7/2002 | McTeer | 438/612 |
| 2003/0037959 A1 | * | 2/2003 | Master et al. | 174/256 |
| 2003/0132025 A1 | * | 7/2003 | Wakihara et al. | 174/256 |
| 2003/0170450 A1 | * | 9/2003 | Stewart et al. | 428/343 |
| 2003/0211425 A1 | * | 11/2003 | Mao et al. | 430/311 |
| 2003/0218249 A1 | * | 11/2003 | Ho et al. | 257/737 |
| 2004/0164414 A1 | * | 8/2004 | Venkateswaran | 257/738 |
| 2004/0166659 A1 | * | 8/2004 | Lin et al. | 438/611 |

* cited by examiner

*Primary Examiner*—Lynne R. Edmondson
(74) *Attorney, Agent, or Firm*—Rosenberg, Klein & Lee

(57) ABSTRACT

This invention relates to an integrated circuit package and a method for the same, especially relates to the integrated circuit package without a solder mask and the method for the same. A solder wettable metal is used as the material of the first solder pad and a non-wettable insulating layer is formed on the top surface and sidewalls of the metal layer, which is not solder pads, in the integrated circuit packages without a solder mask of the present invention to avoid short circuit defects and to increase a circuit density and reliability of the integrated circuit packages.

21 Claims, 6 Drawing Sheets

INTEGRATED CIRCUIT PACKAGES WITHOUT SOLDER MASK AND METHOD FOR THE SAME

BACKGROUND OF THE INVENTION

1. Field of the Invention

This invention relates to an integrated circuit package structure and a method for the same, especially relates to the integrated circuit package without a solder mask and the method for the same to increase a circuit density and the reliability of the integrated circuit package.

2. Description of the Prior Art

Integrated circuits are typically housed within a plastic package, for example a quad flat pack (QFP). Flat packs contain a lead frame, which has a plurality of leads that are connected to an integrated circuit die. The die is encapsulated by a hard plastic housing, which mechanically supports and electrically insulates the integrated circuit. The leads are typically soldered to a printed circuit board.

Packaging techniques for integrated circuits have been developed in the past in an attempt to satisfy demands for miniaturization in the integrated circuit industry. Improved methods for miniaturization of integrated circuits enabling the integration of millions of transistor circuit elements into single integrated silicon embodied circuits, or chips, have resulted in an increased emphasis on methods to package these circuits with space efficiency.

Integrated circuits are manufactured from a silicon wafer using various etching, doping, depositing and cutting steps that are well know in the art of fabricating integrated circuit devices. A silicon wafer may be comprised of a number of integrated circuit dies that each represents a single integrated circuit chip. Ultimately, transfer molding plastic encasement around the chip with a variety of pin-out or mounting and interconnection schemes may package the chip. For example, M-Dip (Dual-In-Line-Plastic) provides a relatively flat, molded package having dual parallel rows of leads extending from the bottom for through-hole connection and mounting to an underlying printed circuit board. More compact integrated circuits allowing greater density on a printed circuit board are the SIP (Single-In-Line-Plastic), and SOJ (Small Outline J-leaded) molded case packages.

According to numbers of chips in the integrated circuit packages, the integrated circuit packages can be divided into a single chip package (SCP) type and a multichip package (MCP) type. The multichip package type also comprises a multichip module (MCM) type. According to a type for coupling a substrate and an element, the integrated circuit packages can be divided into a pin-through-hole (PTH) type and a surface mount technology (SMT) type. A lead frame of the pin-through-hole type element is thin acicular or a sheet metal to be inserted into a socket or a via of the substrate and to be fixed by using soldering process. The surface mount technology type element is adhered directly on the substrate and then is fixed by using a soldering process. At present, the more advanced process for packaging integrated circuits is a direct chip attached (DCA) packaging process to decrease the volume of an integrated circuit package and to increase the circuit density on the inside of the integrated circuit package. The direct chip attached packaging process is to fix the integrated circuit chip on the substrate directly and then to couple the circuit elements with each other.

Referring to FIG. 1, this shows a diagram in fixing a chip on a substrate with a solder mask. At first, a substrate 10 and a chip 40 is provided, wherein the substrate comprises a plurality of layout circuit leading wires 25, a plurality of the first solder pads 20, solder mask 30, and a pre-soldering 18 (can be omitted following needs of products and processes).

The chip 40 comprises a plurality of the second solder pads 45 and a plurality of solder bumps 15. The plural solder bumps 15 are coupled to the chip 40 by using the plural second solder pads 45. Then chip 40 is coupled to the plural first solder pads 20 or pre-soldering 18, which is on the substrate 10. By using the plural solder bumps 15 to fix chip 40 on substrate 10, wherein a location of each of the solder bumps 15 is corresponding to each of the first solder pads 20.

In the traditional integrated circuit package, the objective using solder mask 30, is to avoid the layout circuit leading wires 25, on substrate 10, from outside environmental damage, and to prevent a short circuit because of overflow of the solder bumps 15 in the following process. Therefore, in the traditional integrated circuit package with a solder mask, the solder mask 30 must be covered on the layout circuit leading wires 25 to prevent the layout circuit leading wires 25 on the substrate 10. In order to provide better protective capabilities, the solder mask 30 must be further covered partially on each first solder pad 20 on substrate 10 to avoid a short circuit because of the overflow of solder bumps 15 in the following process. Because a solder mask 30 must be covered partially on each first solder pad 20 of substrate 10, an extra boundary around each first solder pad 20 must be reserved to connect the solder bump with enough allowance and tolerance in the traditional integrated circuit package with a solder mask. Because of the extra boundary, the numbers of circuit leading wires, which are located between any of the two first solder pad 20's on substrate 10, will be decreased and the volume of the integrated circuit package with solder masks will not be successfully reduced. Therefore, the traditional technology is not used in the integrated circuit package whose volume suitability has becomes smaller and smaller.

Because the solder mask must be covered partially on each first solder pad in the integrated circuit package with solder mask, the misalignment in the solder bump location will affect the quality of the integrated circuit package when the solder bump is coupled to the first solder pad. When the substrate comprises more circuit layers, the solder mask will not be filled in the needed location and will in affect have short circuit defects. When the flip chip (FC) type, which means not all of the integrated circuits are covered with the mounding compound, is used to package the integrated circuit or the combination ability between the solder mask and the underfill is less, the solder mask will come off the circuit leading wire to cause a lower reliability and short circuit defects.

SUMMARY OF THE INVENTION

In accordance with the background of the above-mentioned invention, the volume of the traditional integrated circuit package with a solder mask cannot be successfully reduced and the solder mask will come off the circuit leading wire more easily to cause a short circuit defect. The present invention provides an integrated circuit package without a solder mask and a method for the same to avoid short circuit defects, by using solder wettable metal as the material of the first solder pad and when forming an insulating layer whose material is solder non-wettable metal on the top surface and sidewall surface of the metal layer which is used as the circuit.

The second object of this invention is to increase the circuit density on the substrate of the integrated circuit package, by using a solder wettable metal as the material of the first solder pad and when forming an insulating layer whose material is solder non-wettable metal on the top surface and sidewall surface of the metal layer which is used as the circuit.

The third object of this invention is to increase the reliability of the integrated circuit package by using a solder wettable metal as the material of the first solder pad and when forming an insulating layer whose material is solder non-wettable metal on the top surface and sidewall surface of the metal layer which is used as the circuit.

The fourth object of this invention is to increase the yield of the integrated circuit package by using a solder wettable metal as the material of the first solder pad and when forming an insulating layer whose material is solder non-wettable metal on the top surface and sidewall surface of the metal layer which is used as the circuit.

The fifth object of this invention is to shorten the packaging process and to increase the production efficiency of the integrated circuit package by using a solder wettable metal as the material of the first solder pad and when forming an insulating layer whose material is solder non-wettable metal on the top surface and sidewall surface of the metal layer which is used as the circuit.

The further object of this invention is to decrease the production cost of the integrated circuit package by using a solder wettable metal as the material of the first solder pad and when forming an insulating layer whose material is solder non-wettable metal on the top surface and sidewall surface of the metal layer which is used as the circuit.

In accordance with the foregoing objects, the present invention provides an integrated circuit package without a solder mask and a method for the same to avoid short circuit defects by using solder wettable metal as the material of the first solder pad and when forming an insulating layer whose material is solder non-wettable metal on the top surface and sidewall surface of the metal layer which is used as the circuit. At first, a substrate is provided and a metal layer is formed on the substrate, wherein a material of the metal layer is usually copper. After the locations of the first solder pads are defined for later use on the metal layer, the first photoresist layer is formed, with plurality openings, that show the metal layer at the bottom, are formed. Then the first solder pads are formed at the bottom of the openings and the first photoresist layer is removed, wherein the first solder pads are solder wettable metal and are formed by using an electric/chemical electroplating process or a physical/chemical deposition process. Then the second photoresist layer is formed on the metal layer to remove a part of the metal layer to form a needed conductive circuit pattern on the substrate. Then the second photoresist layer is removed to form a plurality of solder interfaces, which comprise the first solder pads, and the conductive circuit pattern, wherein the first solder pads of the solder interfaces and the conductive circuit pattern are used as the circuits on the surface of the substrate. Finally, an insulating layer with a material that's solder non-wettable metal, is formed on the top surface, and sidewall surface, of the metal layer, and the process for manufacturing surface circuits on the substrate of an integrated circuit package without a solder mask is finished. A chip, which is coupled to the plural solder bumps and the plural second solder pads by using a plural pre-solder, can be coupled to the plural pre-solder and the plural first solder pads directly by heating the plural solder bumps in the soldering process to fix the chip on the substrate. At last, a molding compound is covered on the substrate or an underfill mode is used to protect the circuits and the chip on the substrate. Then the process for packaging integrated circuit without a solder mask is finished. Using the integrated circuit package and the method for the same of the present invention can increase the circuit density on the substrate and the reliability of the integrated circuit package. Using the integrated circuit package and the method for the same of the present invention can also increase the yield and the production efficiency of the integrated circuit package. Using the integrated circuit package and the method for the same of the present invention can further decrease production costs of the integrated circuit package.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
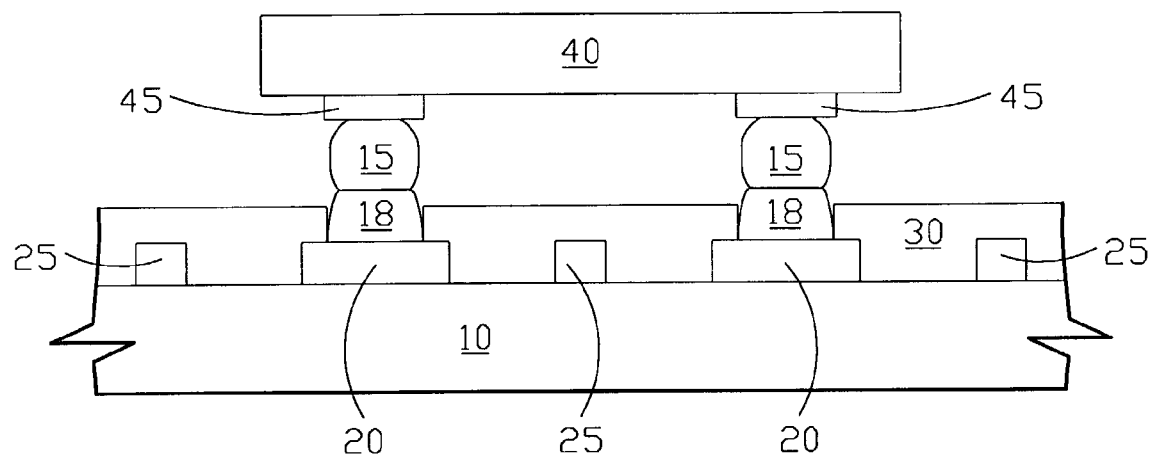
FIG. 1 shows a diagram in using the traditional method to fix a chip on the substrate with a solder mask.
Figure 2:
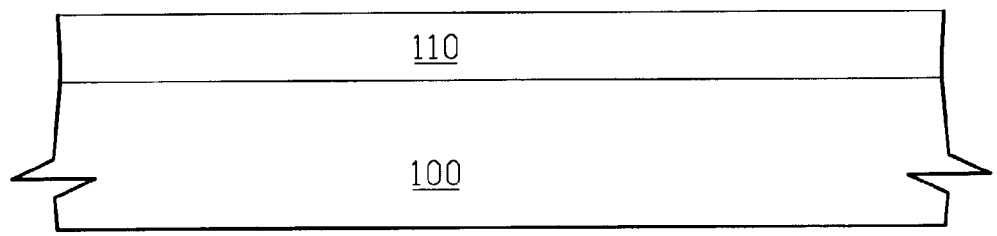
FIG. 2 shows a diagram in forming a metal layer on the substrate.
Figure 3:
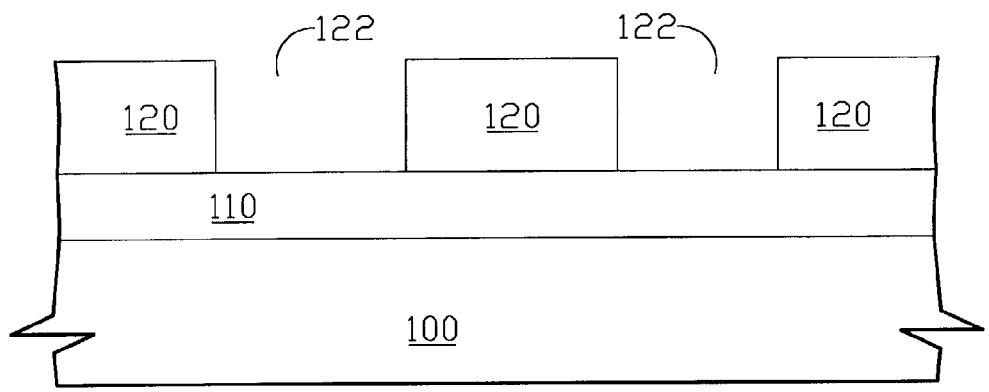
FIG. 3 shows a diagram in forming the first photoresist layer on a part of the metal layer.

The foregoing aspects and many of the attendant advantages of this invention will become more readily appreciated as the same becomes better understood by reference to the following detailed description, when taken in conjunction with the accompanying drawings, wherein:

The present invention provides an integrated circuit package without a solder mask and a method for the same to avoid short circuit defects by using solder wettable metal as the material of the first solder pad and when forming an insulating layer whose material is solder non-wettable metal on the top surface and sidewall surface of the metal layer which is used as the circuit. Referring to FIG. 2, this shows a diagram in forming a metal layer on the substrate. The inner circuits of the substrate are omitted because those are not key points of the present invention. At first, a substrate 100 is provided and a metal layer 110 is formed on the substrate 100 of the present invention. A material of the metal layer 110 can be changed following the needs of individual products. In usual procedures, the material of the metal layer 110 is copper. Referring to FIG. 3, this shows a diagram in forming the first photoresist layer on part of the metal layer. When locations of the first solder pads are defined on the metal layer 110, the first photoresist layer is formed on the part of the metal layer which is not used to form the first solder pads. Plurality openings 122, which show the metal layer at the bottom, are formed in the photoresist layer.

Figure 4:
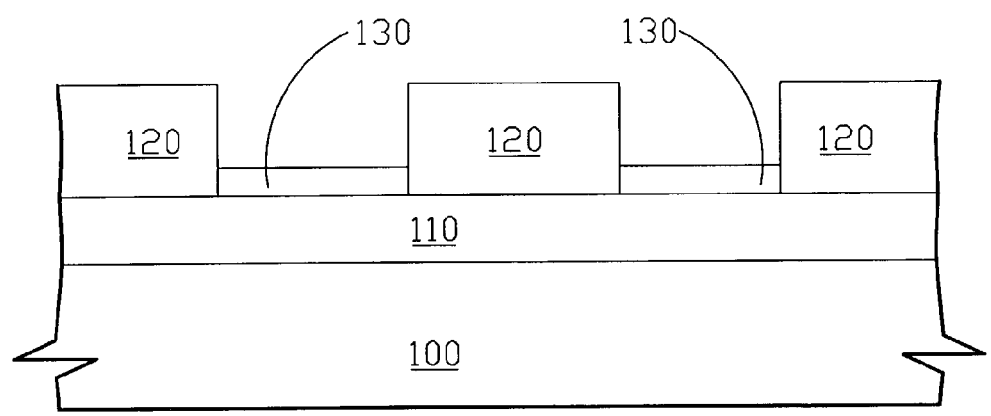
FIG. 4 shows a diagram in forming the first solder pad at the bottom of each opening and on the metal layer.
Figure 5:
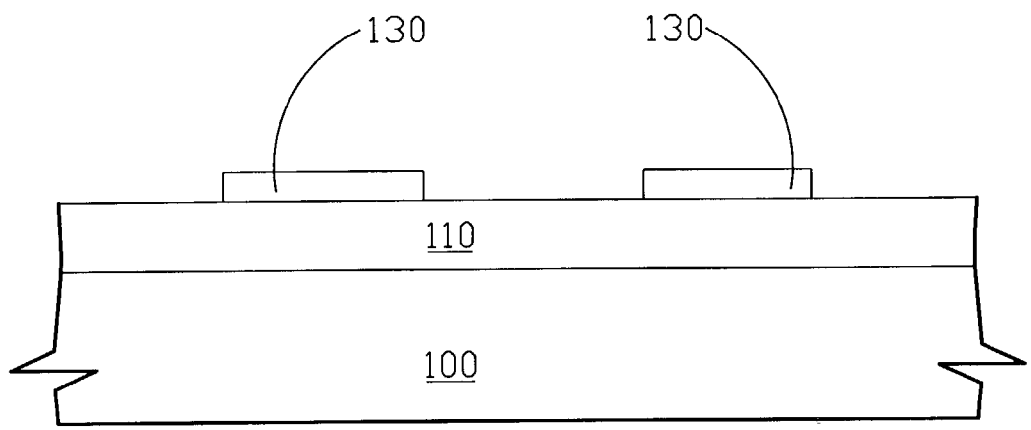
FIG. 5 shows a diagram in removing the first photoresist layer and forming the first solder pad on a part of the metal layer.

Referring to FIG. 4, this shows a diagram in forming the first solder pad at the bottom of each opening and on the metal layer. Referring to FIG. 5, this shows a diagram in removing the first photoresist layer and forming the plural first solder pads on part of the metal layer. After forming plurality openings 122 on the metal layer 110 by using the first photoresist layer 120, the first solder pad 130 is formed at the bottom of the each opening 122 and on the metal layer 110 and the first photoresist layer 120 is removed to form the plural first solder pads 130 on part of the metal layer 110. The first solder pad is used to couple to the first solder bump in the following process to make a chip that can be attached on the substrate. A material of the first solder pad 130 is solder wettable metal. A thickness and a width of the first solder pad 130 can be varied accordingly for different products and processes. A pitch between any two first solder pads is also changed accordingly for different products and processes. In usual methods, the first solder pads can be formed by using an electric/chemical electroplating process or a physical/chemical deposition process.

Figure 6:
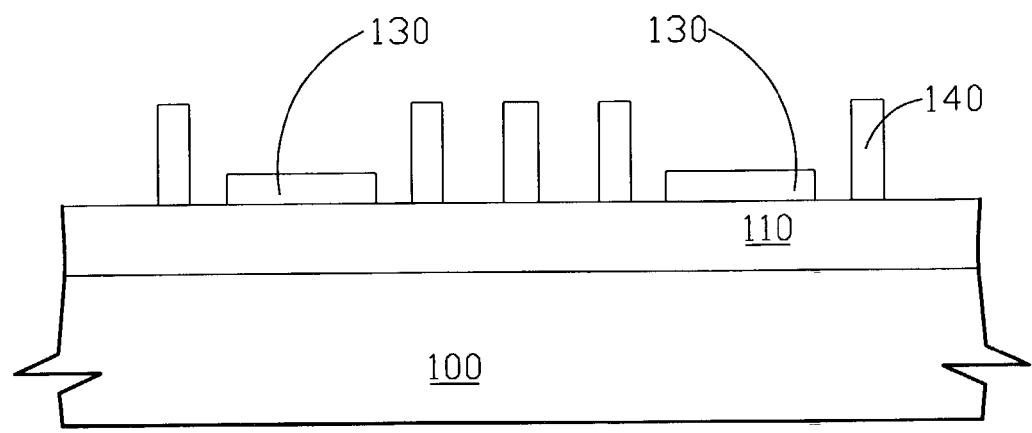
FIG. 6 shows a diagram in forming the second photoresist layer on a part of the metal layer.
Figure 7:
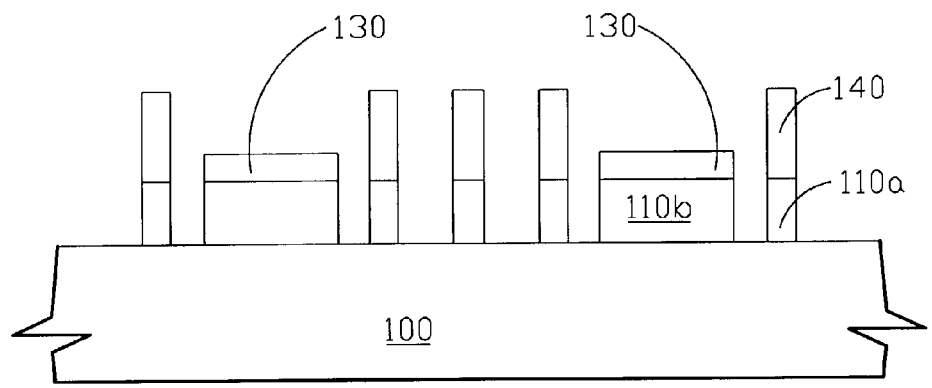
FIG. 7 shows a diagram in removing a part of the metal layer.
Figure 8:
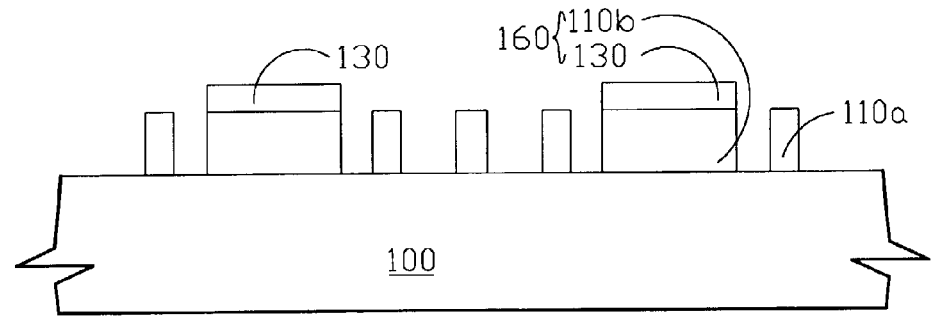
FIG. 8 shows a diagram in removing the second photoresist layer to form the plural metal layers and solder interfaces on the substrate.

Referring to FIG. 6, this shows a diagram in forming the second photoresist layer on part of the metal layer. After removing the first photoresist layer 120, the second photoresist layer 140 is formed on part of the metal layer 110. An objective of the second photoresist layer 140 is to define circuits of the substrate 100. Referring to FIG. 7, this shows a diagram in removing a portion of the metal layer. After forming the second photoresist layer 140 on a part of the metal layer 110, the other part of the metal layer which is not covered by the second photoresist layer 140 is etched and then the second photoresist layer 140 is removed (referring to FIG. 8) to form the plural metal wire layers 110a and the plural solder interfaces 160 on the substrate 100, wherein each solder interface 160 comprises the metal layer 110b and the first solder pad 130. After removing the second photoresist layer 140, the plural metal wire layers, which remain on the substrate 100, are conductive circuits which are needed to form the substrate 100. In removing a part of the metal layer 110 process, the metal layer 110b which is in the solder interface 160 and under the first solder pad 130 cannot be removed because its protecting the first solder pad 130. Therefore, even the second photoresist layer 140 is not formed on the first solder pads 130, the metal layer 110b, which is in the solder interface 160 is not removed.

Figure 9:
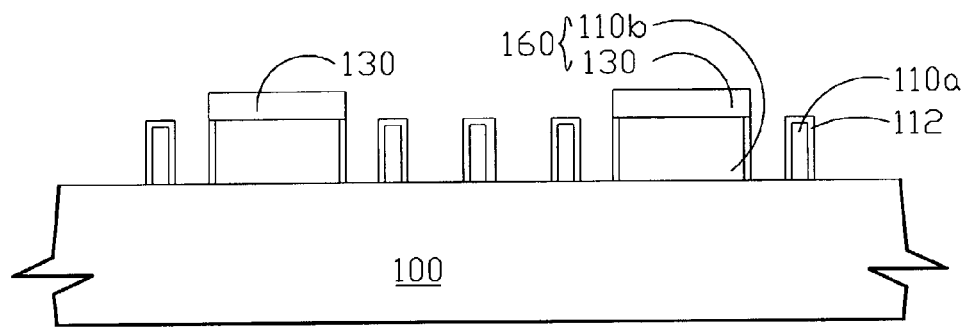
FIG. 9 shows a diagram in forming an insulating layer on the surface of the metal layer.

Referring to FIG. 9, this shows a diagram in forming an insulating layer on the surface of the metal layer. After the plural metal wire layers 110a and the plural solder interfaces 160 are formed on part of the substrate 100, an insulating layer 112 whose material is solder non-wettable metal is formed on the top surface and sidewall surface of the metal layer. The main objective of the insulating layer 112 is to protect from short circuit defects in the integrated circuit package without a solder mask, when the first solder bump may overflow in the following process. In usual methods, the substrate is proceeded with an oxidation process to form a metal oxide layer, which is used as the insulating layer 112, on the top surface and sidewall surface of the metal layer. A thickness of the insulating layer 112 can be changed accordingly to the needs of different products and processes.

Figure 10:
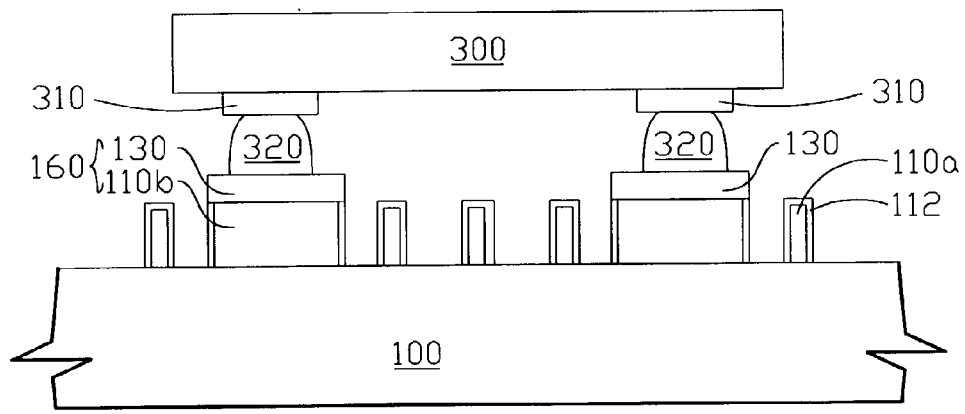
FIG. 10 shows a diagram in fixing the chip on the substrate.

After forming the insulating layer on the top surface and sidewalls of the metal layer, a release film (not shown in the figures) can be formed on the surface of the substrate to avoid surface pollutions from the outside environment or scrapes on the surface of the substrate when the substrate is in the transportation process to following processes. After the substrate is transported to the next process, the release film can be easily stripped from the surface of the substrate. After passing through a simple cleaning process or glue residual removing process, the substrate can proceed directly with the next process. Referring to FIG. 10, this shows a diagram in attaching the chip to the substrate. After the substrate 100 passing through the oxidation process, a chip 300 can be coupled to substrate 100 with each other.

Figure 11:
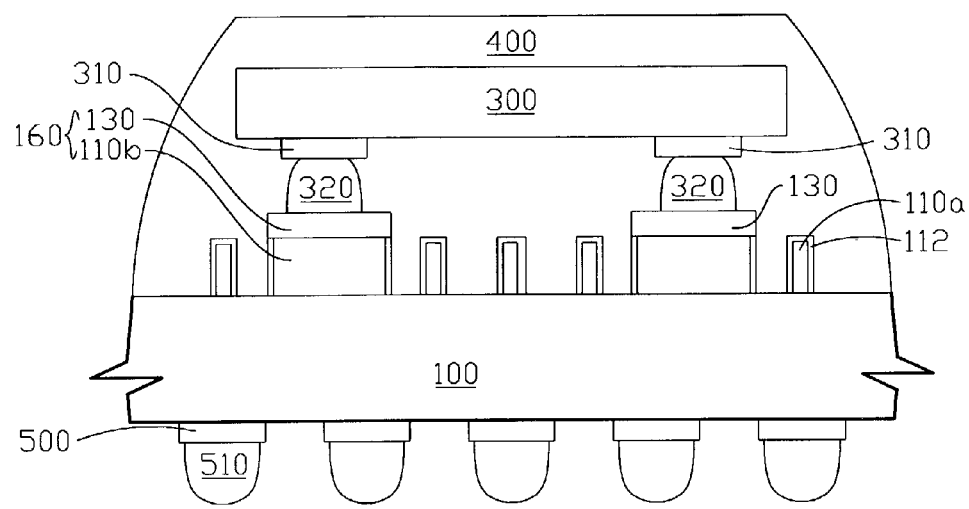
FIG. 11 shows a diagram in forming molding compound on the chip and the substrate and coupling the plural second solder bumps at the bottom of the substrate.

The chip 300 is coupled to the plural first solder bumps 320 by using the plural second solder pads 310 and the location of each second solder pad 310 corresponds to the location of each first solder bump 320. The chip further comprises a protecting layer to protect the chip and avoid damage defects that occur when the chip is in the heating process. The plural first solder bump 320 can be coupled to the plural first solder pads 130 which are on the substrate 100 by using a heating process to fix the chip 300 on the substrate 100. Each first solder bump 320 corresponds to each first solder pad 130 more easily. Because a solder mask is not used in the present invention and there are no location problems when the first solder bump 320 is coupled to the first solder pad 130, the present invention can increase production efficiency and decrease production costs of the integrated circuit package. Fixing the chip on the substrate is one embodiment of the present invention and a scope of the present invention that is not limited. The present invention can further use the first solder pad, which is in the solder interface, coupling to other circuit elements by conductive wires. After fixing the chip 300 on the substrate 100, the chip 300 and connection locations between the chip 300 and the substrate can be covered by using a package molding compound mold and an underfill mode that protects the circuits. This is located on the chip 300 and the substrate 100, to avoid effects, which will decrease the proceeding efficiency of the integrated circuit package, from the outside environment (referring to FIG. 11). Then the process for packaging the integrated circuit without a solder mask is finished. A plurality of second solder bumps 510 can be coupled to the bottom of the substrate by using a plurality of third solder pads 500 to make the integrated circuit package without a solder mask couple to other elements, wherein the third solder pads 500 are ball pads and the second solder bumps 510 are solder balls in usual. Referring to FIG. 11, this shows a diagram in forming a molding compound on the chip and the substrate and coupling the plural second solder bumps at the bottom of the substrate. Using the plural second solder bumps 510 to couple the bottom of the substrate 100 is one embodiment of the present invention and the scope of the present invention is not limited. The integrated circuit packages without a solder mask of the present invention can further couple to other elements by using other packaging molds.

Because a solder mask is not used in the present invention, the area around of the first solder pad does not need the extra boundary and more circuits can be laid between any of the two first solder pads. This condition can decrease the volume of the integrated circuit package without a solder mask successfully and the integrated circuit package without a solder mask can comprise more circuits to increase the efficiency of the decreased integrated package and to increase the reliability of the integrated circuit package.

In accordance with the present invention, the present invention provides an integrated circuit package without a solder mask and a method for the same avoid short circuit defects by using a solder wettable metal as the material of the first solder pad and when forming an insulating layer whose material is solder non-wettable metal on the top surface and sidewall surface of the metal layer which is used as the circuit. At first, a substrate is provided and a metal layer is formed on the substrate, wherein a material of the metal layer is usually copper. After the locations of the first solder pads are defined on the metal layer, the first photoresist layer is formed on a part of the metal layer which is not used to form the first solder pads. Plurality openings, that show the metal layer at the bottom of it, are formed in the photoresist layer. Then the first solder pads are formed at the bottom of the openings and the first photoresist layer is removed, wherein the first solder pads are solder wettable metal and are formed by using an electric/chemical electroplating process or a physical/chemical deposition process. Then the second photoresist layer is formed on the metal layer to remove part of the metal layer and to form a needed conductive circuit pattern on the substrate. Then the second photoresist layer is removed to form a plurality of solder interfaces, which comprise the first solder pads, and the conductive circuit pattern, wherein the first solder pads of the solder interfaces and the conductive circuit pattern are used as circuits on the surface of the substrate. At last, an insulating layer whose material is solder non-wettable metal is formed on the top surface and sidewall surface of the metal layer and the process for manufacturing surface circuits of the substrate of the integrated circuit package without a solder mask is finished. A chip, which is coupled to plural solder bumps and the plural second solder pads by using plural pre-solder, can be coupled to the plural pre-soldering and the plural first solder pads directly by heating the plural solder bumps in the soldering process to fix the chip on the substrate. At last, a molding compound is covered on the substrate or an underfill mode is used to protect the circuits and the chip on the substrate. Then the process for packaging integrated circuit without a solder mask is finished. Using the integrated circuit package and the method for the same of the present invention can increase the circuit density on the substrate and reliability of the integrated circuit package. Using the integrated circuit package and the method for the same of the present invention can also increase the yield and the production efficiency of the integrated circuit package. Using the integrated circuit package and the method for the same of the present invention can further decrease production costs of the integrated circuit package.

Although specific embodiments have been illustrated and described, it will be obvious to those skilled in the art that various modifications may be made without departing from what is intended to be limited solely by the appended claims.

What is claimed is:

1. An integrated circuit package without solder mask, said integrated circuit package comprising:
    a package substrate for packaging at least one chip without a solder mask thereon;
    a plurality of metal patterns on said package substrate to form conductive circuits without completely covering said package substrate;
    a plurality of the first solder pads over selected said metal patterns to form solder interface, wherein said solder pad is solder wettability; and
    an insulating layer covering said metal patterns without covering said package substrate, wherein said insulating layer is solder non-wettability.

2. The integrated circuit package according to claim 1, wherein said metal pattern is copper.

3. The integrated circuit package according to claim 1, wherein said package substrate is bonded with a chip.

4. The integrated circuit package according to claim 3, wherein said chip is coupled to a plurality of solder bumps by using a plurality of the second solder pads.

5. The integrated circuit package according to claim 4, wherein each of said solder bumps is corresponding to each of said second solder pads.

6. The integrated circuit package according to claim 4, wherein a plurality of said solder bumps is coupled to a plurality of said first solder pads to hold said chip on said substrate.

7. The integrated circuit package according to claim 6, wherein each of said solder bumps is corresponding to each of said first solder pads.

8. The integrated circuit package according to claim 1, wherein said insulating layer is metal oxide.

9. The integrated circuit package according to claim 3, wherein said chip and a connection location between said chip and said substrate are covered by using an underfill packaging mold.

10. A method for packaging an integrated circuit without solder mask, said method comprising:
    providing a package substrate for packaging at least one chip without a solder mask thereon;
    forming a metal layer on said package substrate without completely covering said package substrate;
    forming a plurality of the first solder pads over said metal layer, wherein said solder pad is solder wettability;
    forming a photoresist pattern to define conductive traces;
    etching said metal layer to form solder interface and said conductive traces by using said first solder pads and photoresist pattern as a mask;
    removing said photoresist pattern; and
    forming an insulating layer covering said metal patterns without covering said package substrate, wherein said insulating layer is solder non-wettability.

11. The method according to claim 10, wherein said metal layer is copper.

12. The method according to claim 10, wherein said first solder pads are formed by using an electric electroplating process.

13. The method according to claim 10, wherein said first solder pads are formed by using a chemical electroplating process.

14. The method according to claim 10, wherein said first solder pads are formed by using a physical deposition process.

15. The method according to claim 10, wherein said first solder pads are formed by using a chemical deposition process.

16. The method according to claim 10, wherein said package substrate is bonded with a chip.

17. The method according to claim 16, wherein said chip is coupled to a plurality of solder bumps by using a plurality of the second solder pads.

18. The method according to claim 17, wherein each of said solder bumps is corresponding to each of said second solder pads.

19. The method according to claim 17, wherein a plurality of said solder bumps is coupled to a plurality of said first solder pads to fix said chip on said package substrate.

20. The method according to claim 19, wherein each of said solder bumps is corresponding to each of said first solder pads.

21. The method according to claim 10, wherein said insulating layer is metal oxide.

* * * * *